United States Patent [19]

Heuermann et al.

[11] Patent Number: 5,666,059
[45] Date of Patent: Sep. 9, 1997

[54] METHOD FOR CALIBRATING A NETWORK ANALYZER ACCORDING TO THE FIFTEEN-TERM PRINCIPLE

[75] Inventors: Holger Heuermann, Tittmoning; Burkhard Schiek, Bochum, both of Germany

[73] Assignees: Rohde & Schwarz GmbH & Co. KG, Munich; Rosengerger Hochfrequenztechnik GmbH & Co., Tittmoning, both of Germany

[21] Appl. No.: 539,086

[22] Filed: Oct. 4, 1995

[30] Foreign Application Priority Data

Oct. 5, 1994 [DE] Germany .................. 44 35 559.9

[51] Int. Cl.$^6$ .................................. G01R 27/06
[52] U.S. Cl. ............... 324/601; 324/638; 364/571.02
[58] Field of Search ...................... 324/601, 638, 324/642, 650, 612; 364/571.01, 571.02

[56] References Cited

U.S. PATENT DOCUMENTS

| | | | |
|---|---|---|---|
| 4,982,164 | 1/1991 | Schiek et al. | 324/601 |
| 5,313,166 | 5/1994 | Eul et al. | 324/601 |
| 5,442,296 | 8/1995 | Schiek et al. | 324/601 |

*Primary Examiner*—Michael Brock
*Attorney, Agent, or Firm*—Hill, Steadman & Simpson

[57] ABSTRACT

In a method for calibrating a network analyzer having two test ports and at least four measuring locations according to the fifteen-term principle, correction values that are taken into consideration in the following subject measurements are calculated by successive measurement of the transmission and reflection parameters at five calibration standards that are successively connected in arbitrary sequence between the two test ports. A one-port network having a known impedance or open circuit is used as a calibration standard for the first calibration measurement. It is being successively connected to the two test ports (MM or OO double one-port network calibration) and four calibration standards are used for the other four calibration methods. Only eleven of the total of sixteen scatter parameters of these four calibration standards are known, whereas the remaining, five unknown scatter parameters are subsequently calculated from the total of measured values.

19 Claims, 4 Drawing Sheets

| MURN | CALIBRATION STANDARDS | | | | |
|---|---|---|---|---|---|
| | 1. | 2. | 3. | 4. | 5. |
| Name | MM | UU | RR | N1 | N2 |
| $S_{11} =$ | 0 | $\rho$ | $\gamma$ | ra | na |
| $S_{12} =$ | 0 | 0 | 0 | $\ell$ | t |
| $S_{21} =$ | 0 | 0 | 0 | $\ell$ | t |
| $S_{22} =$ | 0 | $\rho$ | $\gamma$ | rb | nb |
| Unbek. | 0 | 1 | 1 | 3 | 3 |

MURN CALIBRATION STANDARDS STRUCTURE

FIG. 3

| MORN | CALIBRATION STANDARDS | | | | |
|---|---|---|---|---|---|
| | 1. | 2. | 3. | 4. | 5. |
| Name | MM | OO | RR | L | N |
| $S_{11} =$ | 0 | 1 | $\gamma$ | 0 | na |
| $S_{12} =$ | 0 | 0 | 0 | $\ell$ | t |
| $S_{21} =$ | 0 | 0 | 0 | $\ell$ | t |
| $S_{22} =$ | 0 | 1 | $\gamma$ | 0 | nb |
| Unbek. | 0 | 0 | 1 | 1 | 3 |

MORN CALIBRATION STANDARDS STRUCTURE

FIG. 4

| TMRN | CALIBRATION STANDARDS | | | | |
|---|---|---|---|---|---|
| | 1. | 2. | 3. | 4. | 5. |
| Name | MM | UU | RR | T | N |
| $S_{11} =$ | 0 | ρ | γ | 0 | na |
| $S_{12} =$ | 0 | 0 | 0 | 1 | t |
| $S_{21} =$ | 0 | 0 | 0 | 1 | t |
| $S_{22} =$ | 0 | ρ | γ | 0 | nb |
| Unbek. | 0 | 1 | 1 | 0 | 3 |

TMRN CALIBRATION STANDARDS STRUCTURE

FIG. 5

| MONS | CALIBRATION STANDARDS | | | | |
|---|---|---|---|---|---|
| | 1. | 2. | 3. | 4. | 5. |
| Name | MM | OO | SS | UR | N |
| $S_{11} =$ | 0 | 1 | -1 | ra | na |
| $S_{12} =$ | 0 | 0 | 0 | 0 | t |
| $S_{21} =$ | 0 | 0 | 0 | 0 | t |
| $S_{22} =$ | 0 | 1 | -1 | rb | nb |
| Unbek. | 0 | 0 | 0 | 2 | 3 |

MONS CALIBRATION STANDARDS STRUCTURE

FIG. 6

| ZONS | CALIBRATION STANDARDS | | | | |
|---|---|---|---|---|---|
| | 1. | 2. | 3. | 4. | 5. |
| Name | OO | UU | RR | Z | N |
| $S_{11} =$ | 1 | $\rho$ | $\gamma$ | ra | na |
| $S_{12} =$ | 0 | 0 | 0 | $\ell$ | t |
| $S_{21} =$ | 0 | 0 | 0 | $\ell$ | t |
| $S_{22} =$ | 1 | $\rho$ | $\gamma$ | rb | nb |
| Unbek. | 0 | 1 | 1 | 3 | 3 |

ZONS CALIBRATION STANDARDS STRUCTURE

METHOD FOR CALIBRATING A NETWORK ANALYZER ACCORDING TO THE FIFTEEN-TERM PRINCIPLE

BACKGROUND OF THE INVENTION

The present invention is directed to a method for calibrating a network analyzer.

A prior art Method of this type is described in U.S. patent application Ser. No. 08/155,826, now U.S. Pat. No. 5,442, 296. In this known, fifteen-term calibration method that uses a total of five calibration standards, all scatter parameters of the calibration standard employed must be completely known. This assumes relatively expensive calibration standards in terms of manufacture.

SUMMARY OF THE INVENTION

It is an object of the present invention to provide an improved fifteen-term calibration method that can be implemented with simple, commercially available calibration standards whose scatter parameters are also partly unknown.

In general terms the present invention is a method for calibrating a network analyzer having two test ports and at least four measuring locations by successive measurement of the transmission and reflection parameters at five calibration standards. The calibration standards are successively connected in arbitrary sequence between the two test ports according to the fifteen-term principle. Correction values that are taken into consideration in following subject measurements are calculated from these measured values. A one-port network having known impedance or open circuit is used as a calibration standard for the first calibration measurement. This one-port network is successively connected to the two test ports (MM or OO double one-port network calibration). Four calibration standards are used for the other four calibration measurements. Only eleven of the total of sixteen scatter parameters are thereof known, whereas the remaining five, unknown scatter parameters are subsequently calculated from the total of measured values.

Advantageous developments of the present invention are as follows. A double one-port network having known impedance is used for the first calibration measurement (MM double one-port network calibration). A second calibration measurement is implemented at a reflection-symmetrical double one-port network (UU) having unknown reflection. A third calibration measurement is implemented at a further, reflection-symmetrical double one-port network (RR) having an unknown reflection that, however, differs from the reflection factor of the second calibration measurement. A fourth calibration measurement is implemented at a reciprocal two-port network (N1) having unknown reflection. Finally, a fifth calibration measurement is implemented at a further, reciprocal two-port network (N2) having known transmission and unknown reflection that, however, differs from the reflection factor of the fourth calibration measurement (MURN calibration).

The second calibration measurement is implemented at a double one-port open circuit (OO) and the fourth calibration measurement is implemented at an electrical line having known characteristic impedance whose electrical propagation constant may be unknown (MORN calibration method).

A fourth calibration measurement is implemented by a direct connection (T) of the two test ports (TMRN method).

The second calibration measurement is implemented at a double one-port open circuit (OO) and the third calibration measurement is implemented at a double one-port short-circuit (SS) (MONS calibration method).

The first calibration measurement is implemented at a double one-port open circuit (OO). A second calibration measurement is implemented at a reflection-symmetrical double one-port network that has the same but unknown impedance at each port. A third calibration measurement is implemented at a further reflection-symmetrical double one-port network that has the same unknown impedance value at each port that, however, differs from the impedance value of the second calibration measurement. A fourth calibration measurement is implemented at a two-port network that is composed of a concentrated, complex but unknown series and/or parallel impedance. A fifth calibration measurement is implemented at a further two-port network that is composed of a concentrated parallel impedance and of a concentrated, unknown series impedance (ZORN calibration method).

One of the two-port networks of the fourth or fifth calibration measurement is formed by a known series impedance.

One of the two-port networks for the fourth or fifth calibration measurement is an electrical line having known characteristic impedance whose electrical propagation constant may be unknown.

A planar stripline is used as the electrical line.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

As in the standard fifteen-term method, five calibration measurements are utilized in the inventive method for identifying a total of fifteen unknown error parameters. However, the calibration standards need not be completely known. It is only necessary that up to five unknown scatter parameters are distributed onto four of the five required calibration standards. Only one of the five required calibration standards need be completely known, whereby a double one-port network MM composed of two wave sinks having a known resistance that also determines the reference impedance, or a double one-port network having a known reflection and composed of two open circuits is used for this purpose. Thus, in the inventive method the greatest variety of known, commercially obtainable calibration standards can be utilized, whereby these need not be completely known with respect to their scatter parameters. On the contrary, they can be simply calculated after the conclusion of the overall calibration procedure. They are calculated from the overall identified measured values. The inventive method can thus be implemented with substantially less outlay with respect to the calibration standards and nonetheless has the advantageous properties of the known fifteen-term method that is also suitable for measurements or in crosstalk between the test prods due to electrical couplings between these test prods.

There are numerous possibilities for the selection of the individual calibration standards. According to what is referred to as the MORN method, for example, an electrical line that can also be constructed in planar stripline technology can be employed for the fourth calibration measurement, the characteristic impedance thereof being known but the propagation constant being unknown. It would also sufficeto fashion the fourth calibration standard as a completely known T-standard (direct through-connection, Through). This yields an extremely undemanding calibration method for coaxial measurements in order, for example, to eliminate crosstalk within the network analyzer.

According to the ZORN method, no wave sinks are employed for the first calibration measurement; rather, a double one-port open circuit network OO is employed. Two double one-port networks having known but different reflection are employed as second and third calibration standards. A series resistor is preferably employed as a forth or fifth calibration standard, this being very simply manufactured with great precision and low parasitic parts in stripline technology.

The inventive method is schematically summarized in tables 1–5. Tables 1–5 correspond to FIGS. 2–6 respectively. Table 1 shows the basic MORN calibration method. Table 5 shows the advantageous ZORN method that can be realized with pure series resistors particularly in stripline technology (on-wafer measurements). In these tables, S11 and S22 denote the complex reflection factors at the input and output of a two-port network and S12 and S21 respectively denote the transmission factors in forward and return direction (scatter parameter). The double letters respectively refer to a double one-port network calibration whereby a one one-port network of the indicated type is respectively successively connected to the two measuring ports. The double letters MM thus denote the double one-port network calibration with a wave sink M (Match) having a known impedance and known reflection. The double letters UU and RR respectively reference a double one-port network calibration standard with unknown reflection ρ or, respectively, γ. The double letters N1 and N2 denote reciprocal two-port networks having unknown reflection ra, rb or, respectively, na, nb but with a finite transmission 1 or, respectively, t.

It may be seen from Table 1 that a total of eight unknown scatter parameters are established given the five standards MM, UU, RR, N1 and N2 employed therein. According to the present invention, calibration standards are selected in arbitrary combination from this total of available calibration standards such that only five scatter parameters are still unknown. See the MORN, TMRM and MONS methods according to Tables 2, 3 and 4 for three examples, whereby L indicates an electrical line having known characteristic impedance but with unknown propagation constant and T indicates a direct connection of the two measuring ports (through-connection). SS is a double one-port network short-circuit and UR is a reciprocal two-port network having unknown reflection ra or, respectively, rb.

Figure 6:
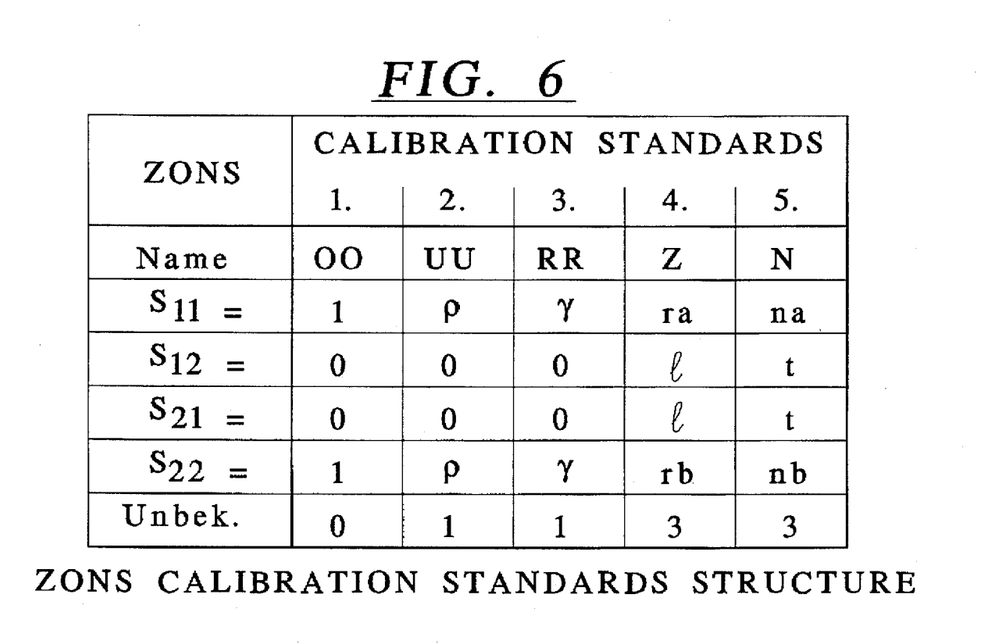
FIG. 6 depicts properties of the ZORN calibration standards.

In the same fashion, calibration standards can be selected from the five calibration standards shown in Table 5 for the ZORN method such that only five of the total of eight unknown scatter parameters according to Table 5 are unknown. The present inventive method can then be implemented. In all of these instances, the five scatter parameters that are as yet unknown are calculated from the total of twenty measured values available after the conclusion of all calibration measurements and the actual correction values are then ultimately calculated in a known way. These are then stored in the network analyzer and correspondingly taken into consideration in following subject measurements.

Figure 1:
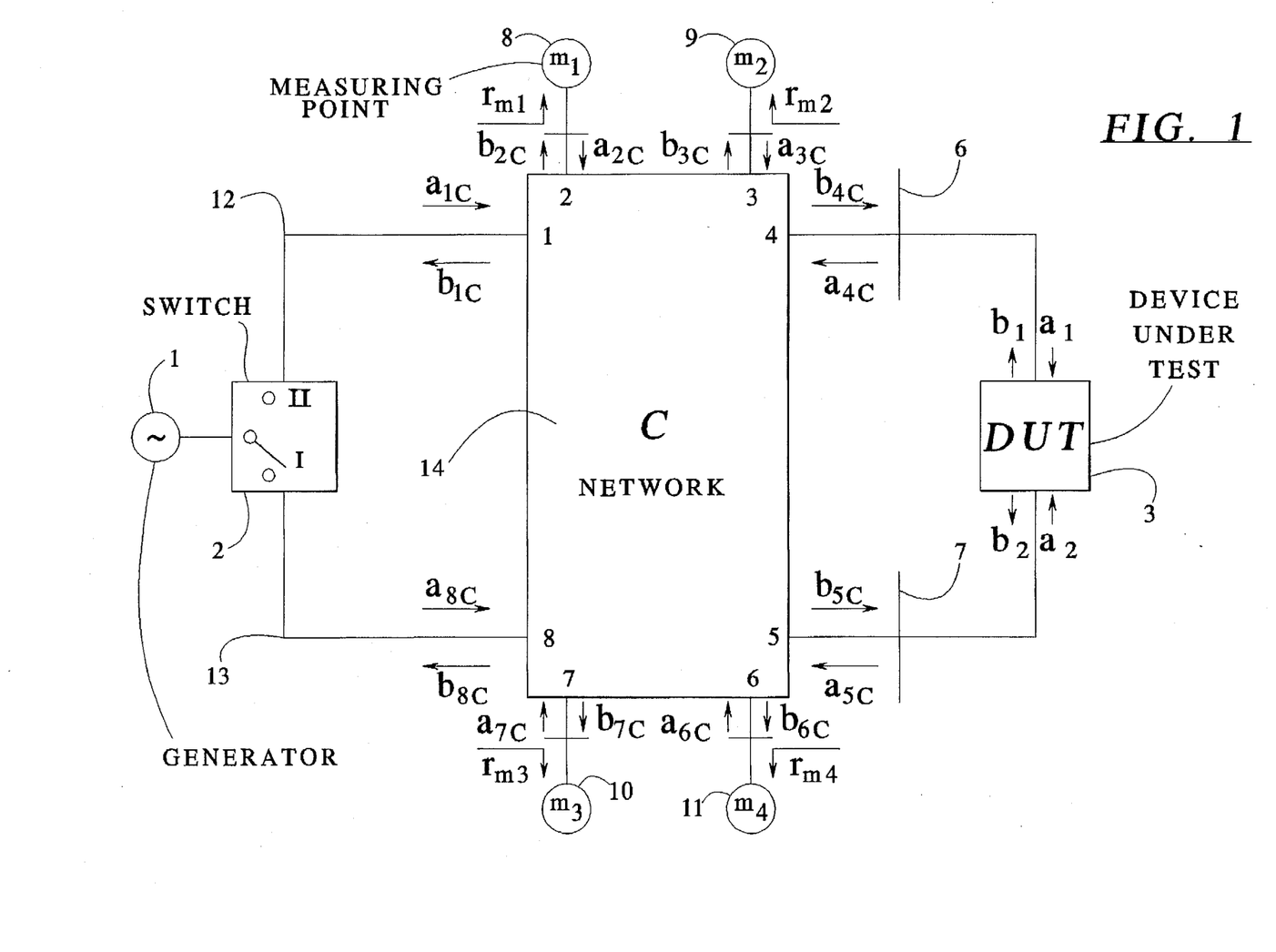
FIG. 1 is a block diagram depicting a network analyzer for use in the method of the present invention.

FIG. 1 shows a highly simplified, schematic circuit diagram of a network analyzer (NWA), whereby two measuring branches 12 and 13 are supplied from a high-frequency generator 1 via a switch-over means 2. These measuring branches discharge in the eight-port network 14 for which a linear transmission behavior and, additionally, a decoupling of the measuring locations 8, 9, 10 and 11 is required. It is advantageous in the case of scatter parameter measurements when this eight-port network has all-around matching and contains bridges for separating the signal flow, so that, for example, the measuring location 8 forms a measure for the outgoing signal from the branch 12 and the measuring location 9 forms a measure for the signal returning from the unit 3 under test through the test port 6. If, however, impedance parameters are to be recorded, such a low-impedance test set can be unbeneficial. Whatever the situation may be, a switch to any linear form of description of networks can be made by employing a method for correcting systematic errors insofar as the decoupling of the measuring locations and a linear transmission behavior of the eight-port network 14 are assured.

The test ports 6 and 7 form the transition to the unit 3 under test and are also referred to as reference levels. According to what is referred to as the full model (fifteen-term model), the disturbance variables occurring between the measuring points 8, 9, 10 and 11 and the unit 3 under test connected to the actual test ports 6 and 7 that are caused, for example, by the connecting lines leading to the unit under test, by mismatches and undesired couplings are thereby taken into consideration with what are referred to as error networks that are identified with a calibration method and are considered in the actual measurement as correction values.

In the calibration measurements, the unit 3 under test is replaced by calibration standards and four measured values for each switch position of the switch-over means 2 are then in turn acquired per standard.

Fundamental Derivation for the Fifteen-Term Method

The mathematical description of both the direct fifteen-term method as well as of the following self-calibration method forms the error model according to FIG. 1.

After an eight-port/four-port reduction of the physical quantities of the test set to an image of all four electrical quantities at the test ports for the four measuring locations, a mathematical formulation of the full model is obtained:

$$\begin{pmatrix} a_3 \\ a_4 \\ b_3 \\ b_4 \end{pmatrix} = [C] \begin{pmatrix} a_1 \\ a_2 \\ b_1 \\ b_2 \end{pmatrix} \quad (1)$$

that, in this case determines signal quantities at the test ports and measuring locations.

When the 4*4 error matrix [C] is resolved into four 2*2 matrices, then, using $$[C] = \begin{pmatrix} [A] & [E] \\ [F] & [B] \end{pmatrix} \quad (2)$$

one proceeds to two matrix equations:

$$[A]\begin{pmatrix} a_1 \\ a_2 \end{pmatrix} + [E]\begin{pmatrix} b_1 \\ b_2 \end{pmatrix} = \begin{pmatrix} a_3 \\ a_4 \end{pmatrix}, \quad (3)$$

$$[B]\begin{pmatrix} b_1 \\ b_2 \end{pmatrix} + [F]\begin{pmatrix} a_1 \\ a_2 \end{pmatrix} = \begin{pmatrix} b_3 \\ b_4 \end{pmatrix} \quad (4)$$

When one has recoursed to the relationship in scattering parameters $$\begin{pmatrix} a_3 \\ a_4 \end{pmatrix} = [Sx] \begin{pmatrix} b_3 \\ b_4 \end{pmatrix} \quad (5)$$

for the unit under test (DUT) and when the matrix equations (3) and (4) are inserted into equation (5), then equation (6) can be obtained.

$$[A]\begin{pmatrix} a_1 \\ a_2 \end{pmatrix} + [E]\begin{pmatrix} b_1 \\ b_2 \end{pmatrix} = [Sx][B]\begin{pmatrix} b_1 \\ b_2 \end{pmatrix} + [Sx][F]\begin{pmatrix} a_1 \\ a_2 \end{pmatrix} \quad (6)$$

This vector equation describes a byliner image of the scatter parameter values of the unit under test onto the measured values for a switch position of the switch-over means 2. Changing what is referred to as the test set switch supplies a second image independent of the first given an unmodified error network.

The error quantities of the error matrices [A], [B], [E] and [F] can be calculated from five different, completely known units under test.

For what is referred to as a self-calibration method, the union of the two vector equations from (6) ensues for the two switch positions as $$[A] + [E][Mx] = [Sx]([B][Mx] + [F]) \quad (7)$$

with the measured value matrix $$[Mx] = \begin{pmatrix} b_1' & b_1'' \\ b_2' & b_2'' \end{pmatrix} \begin{pmatrix} a_1' & a_1'' \\ a_2' & a_2'' \end{pmatrix}^{-1} \quad (8)$$

The MURN Method

Although the direct fifteen-term methods have only been known for a short time, on-wafer calibration standards are available. Although these substrates have hitherto been utilized for the twelve-term and for the LRM method, they already have the necessary double one-port network calibration standards. A general theory that produces self-calibration methods that require standards that may be found on such commercially obtainable calibration substrates.

Derivation of the General MURN Self-Calibration

Figure 2:
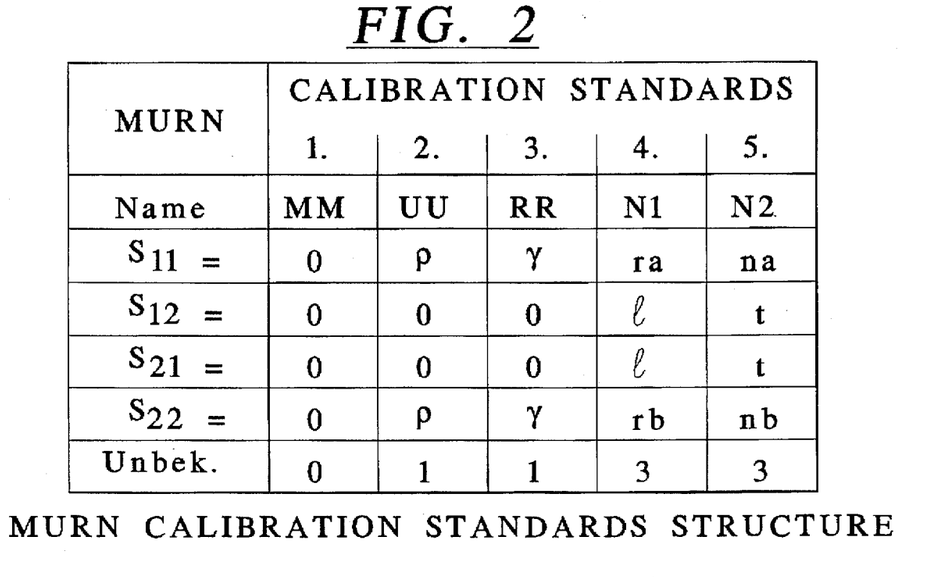
FIG. 2 depicts properties of the MURN calibration standards.

For the derivation of the general MURN method, the five calibration standards should initially contain eight unknown parameters. The structure of the calibration standard is recited in Table 1.

Based on the results of this general derivation, a number of specific calibration methods can be derived by reducing the eight to only five possible, unknown parameters.

When the values of the calibration standards according to Table 1 are inserted into the equation (7) for the five calibration measurements, then the following equation system is obtained:

$$MM: \ [A] + [E][M1] = 0 \quad (9)$$

$$UU: \ [A] + [E][M2] = \rho([B][M2] + [F]) \quad (10)$$

$$RR: \ [A] + [E][M3] = \gamma([B][M3] + [F]) \quad (11)$$

$$N1: \ [A] + [E][M4] = [N1]([B][M4] + [F]) \quad (12)$$

$$N2: \ [A] + [E][M5] = [N2]([B][M5] + [F]) \quad (13)$$

In a first step, the matrix [A] is eliminated in the other equations with equation (9). In a second step, the error matrix [F] in the modified equations (10) and (11) is replaced using the modified equation (12). In the same way, the matrix [F] in the equations (10) and (11) is replaced upon employment of equation (13). Four equations with the unknown error matrices [B] and [E] are thus obtained:

$$\frac{1}{\rho}[E][Ma] + [N1]^{-1}[E][Mb] = [B] \quad (14)$$

$$\frac{1}{\gamma}[E][Mc] + [N1]^{-1}[E][Md] = [B] \quad (15)$$

$$\frac{1}{\rho}[E][Me] + [N2]^{-1}[E][Mf] = [B] \quad (16)$$

$$\frac{1}{\gamma}[E][Mg] + [N2]^{-1}[E][Mh] = [B] \quad (17)$$

The measured value matrices indicated in equations (14) through (17) derive in the following way from the original measured values:

$$[Ma] = ([M2] - [M1])([M2] - [M4])^{-1}, \quad (18)$$

$$[Mb] = ([M1] - [M4])([M2] - [M4])^{-1}, \quad (19)$$

$$[Mc] = ([M3] - [M1])([M3] - [M4])^{-1}, \quad (20)$$

$$[Md] = ([M1] - [M4])([M3] - [M4])^{-1}, \quad (21)$$

$$[Me] = ([M2] - [M1])([M2] - [M5])^{-1}, \quad (22)$$

$$[Mf] = ([M1] - [M5])([M2] - [M5])^{-1}, \quad (23)$$

$$[Mg] = ([M3] - [M1])([M3] - [M5])^{-1}, \quad (24)$$

$$[Mh] = ([M1] - [M5])([M3] - [M5])^{-1}, \quad (25)$$

When equation (14) and (15) are equated, then, after a suitable conversion, the first similarity transformation, equation (26), important for the self-calibration is obtained. When one proceeds in exactly the same way with the equations (16) and (17), then one proceeds to the second transformation equation, (27). A multiplication of these two transformations supplies the third, necessary similarity transformation, (28).

$$\frac{1}{\rho}[Mu] - \frac{1}{\gamma}[Mv] = [E]^{-1}[N1]^{-1}[E] \quad (26)$$

$$\frac{1}{\rho}[Mw] - \frac{1}{\gamma}[Mx] = [E]^{-1}[N2]^{-1}[E] \quad (27)$$

$$\left( \frac{1}{\rho}[Mu] - \frac{1}{\gamma}[Mv] \right)\left( \frac{1}{\rho}[Mw] - \frac{1}{\gamma}[Mx] \right) = \quad (28)$$

$$[E]^{-1}[N1]^{-1}[N2]^{-1}[E]$$

The measured values were combined again as follows:

$$[Mu] = [Ma]([Md] - [Mb])^{-1}, \quad (29)$$

$$[Mv] = [Mc]([Md] - [Mb])^{-1}, \quad (30)$$

$$[Mw] = [Me]([Mh] - [Mf])^{-1}, \quad (31)$$

$$[Mx] = [Mg]([Mh] - [Mf])^{-1}, \quad (32)$$

The utilization of the properties of a similarity transformation, equivalency of the trace and of the determinant of the transformation pair for the equations (26) and (27) and only the trace equivalency of the equation (28) supplies five non-linear equations for five possible, unknown parameters in the calibration standards.

$$\frac{1}{\rho}(Mu_{11}+Mu_{22})-\frac{1}{\gamma}(Mv_{11}+Mv_{22}) = \text{trace}([N1]^{-1}) \quad (33)$$

$$\frac{1}{\rho^2}ua+\frac{1}{\gamma^2}va-\frac{1}{\rho\gamma}ub = det([N1]^{-1}) \quad (34)$$

$$\frac{1}{\rho}(Mw_{11}+Mw_{22})-\frac{1}{\gamma}(Mx_{11}+Mx_{22}) = spur([N2]^{-1}) \quad (35)$$

$$\frac{1}{\rho^2}wa+\frac{1}{\gamma^2}xa-\frac{1}{\rho\gamma}wb = det([N2]^{-1}) \quad (36)$$

$$\frac{1}{\rho^2}xb+\frac{1}{\gamma^2}xc-\frac{1}{\rho\gamma}xd = spur([N1]^{-1}[N2]^{-1}) \quad (37)$$

This equation system contains the following abbreviations for the measured value matrices:

$$ua = det([Mu]), \quad (38)$$

$$va = det([Mv]), \quad (39)$$

$$wa = det([Mw]), \quad (40)$$

$$xa = det([Mx]), \quad (41)$$

$$ub = Mu_{11}*Mv_{22}+Mu_{22}*Mv_{11}-Mu_{21}*Mv_{12}-Mu_{12}*Mv_{21}, \quad (42)$$

$$wb = Mw_{11}*Mx_{22}+Mw_{22}*Mx_{11}-Mw_{21}*Mx_{12}-Mw_{12}*Mx_{21}, \quad (43)$$

$$xb = Mu_{11}*Mw_{22}+Mu_{22}*Mw_{11}+Mu_{21}*Mw_{12}+Mu^{12}*Mw_{21}, \quad (44)$$

$$xc = Mv_{11}*Mx_{22}+Mv_{22}*Mx_{11}+Mv_{21}*Mx_{12}+Mv_{12}*Mx_{21}, \quad (45)$$

$$Mu_{11}*Mx_{11}+Mv_{11}*Mw_{11}+Mu_{12}*Mx_{21}+Mv_{12}*Mw_{21}+xd=$$
$$Mu_{21}*Mx_{12}+Mv_{21}*Mw_{12}+Mu_{22}*Mx_{22}+Mv_{22}*Mw_{22}. \quad (46)$$

When this non-linear equation system is erected for the general case recited here, then a uniform equation system is involved. This requires that a further two-port or double one-port calibration standard is completely known. For deriving calibration methods for the coaxial field, then a known through-connection (T) would be the ideal, known calibration standard.

Since, however, the finite spacing of the test prods does not allow a direct through-connection, this procedure is not applicable for on-wafer measurements. The open circuit is a postulated calibration standard, by contrast, for the full model because all non-idealities of the open circuit are elements of the full model. For this reason, the double one-port network standard RR is replaced by the known standard OO for on-wafer measurements.

A second restriction of the possibilities of the general theory of the MURN calibration technique is found in that the rank of the 15*15 matrix is investigated for identifying the error coefficients. What such a rank investigation yields is that a reflection-asymmetrical calibration standard must be contained in the calibration process. Since on-wafer measurements should manage with optimally few calibration steps, only self-calibration methods that meet this demand shall be derived here.

That a number of interesting calibration methods can be derived despite these limitations shall now be demonstrated with reference to the MORN method given complete derivation and by presenting further, tested methods.

Derivation of the MORN On-Wafer Self-Calibration Method

The MORN calibration method is a matter of a special selection of calibration Standards from the theory for the general MURN self-calibration technique that offers extremely interesting possibilities for on-wafer testing problems for, on the one hand, monitoring the calibration procedure and, on the other hand, in the manufacturability of the calibration standards.

Figure 3:
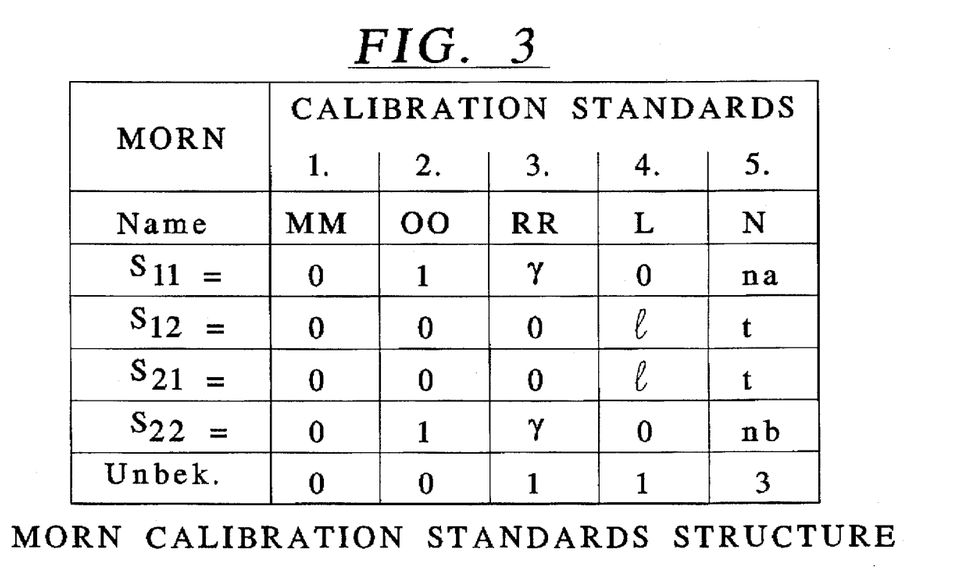
FIG. 3 depicts properties of the MORN calibration standards.

The properties of the MORN calibration standards may be derived from Table 2.

Both the R calibration standard as well as the reflection-asymmetrical N standard are excellently suited for a self-monitoring in that, for example, nearly known subjects such as shorts are utilized for the R standard and the asymmetrical ZY standard discussed in detail above is utilized for the N standard.

Knowledge of the propagation constant of the lines is extremely important for a great number of measurements. This can be simply detected with the MORN method using a short line (L) instead of the N1 standard.

Upon employment of these partially known calibration standards for the equation system (33)–(37), the simplified equation system for the determination of what are referred to as the self-calibration quantities derives:

$$Mu_{11}+Mu_{22}-\frac{1}{\gamma}(Mv_{11}+Mv_{22}) = 0, \quad (47)$$

$$\frac{ua+\frac{1}{\gamma^2}va-\frac{1}{\gamma}ub}{=ya} = \frac{1}{l^2}, \quad (48)$$

$$\frac{Mw_{11}+Mw_{22}-\frac{1}{\gamma}(Mx_{11}+Mx_{22})}{=yb} = na'+nb', \quad (49)$$

$$\frac{wa+\frac{1}{\gamma^2}xa-\frac{1}{\gamma}wb}{=yc} = na'\,nb'-t2, \quad (50)$$

$$\frac{xb+\frac{1}{\gamma^2}xc-\frac{1}{\rho\gamma}xd}{=yd} = \frac{2t}{l}. \quad (51)$$

The simple, final equations for determining the self-calibration quantities are obtained from this largely decoupled system of non-linear equations after a brief intermediate calculation:

$$\gamma = \frac{Mv_{11}+Mv_{22}}{Mu_{11}+Mu_{22}}, \quad (52)$$

$$l = \pm\sqrt{\frac{1}{ya}}, \quad (53)$$

$$t = \frac{l\,yd}{2}, \quad (54)$$

$$na' = \frac{yb}{2} \pm \sqrt{\frac{yb^2}{4}-t2-yc}, \quad (55)$$

$$nb' = yb - na'. \quad (56)$$

Finally, the quantities for the reciprocal network N derive by an inversion of the quantities identified with primes and calculated from the self-calibration process.

$$\begin{pmatrix} na & t \\ t & nb \end{pmatrix} = \begin{pmatrix} na' & t \\ t & nb' \end{pmatrix}^{-1} \quad (57)$$

Discussion of Further Fifteen-Term Self-Calibration Methods

Figure 4:
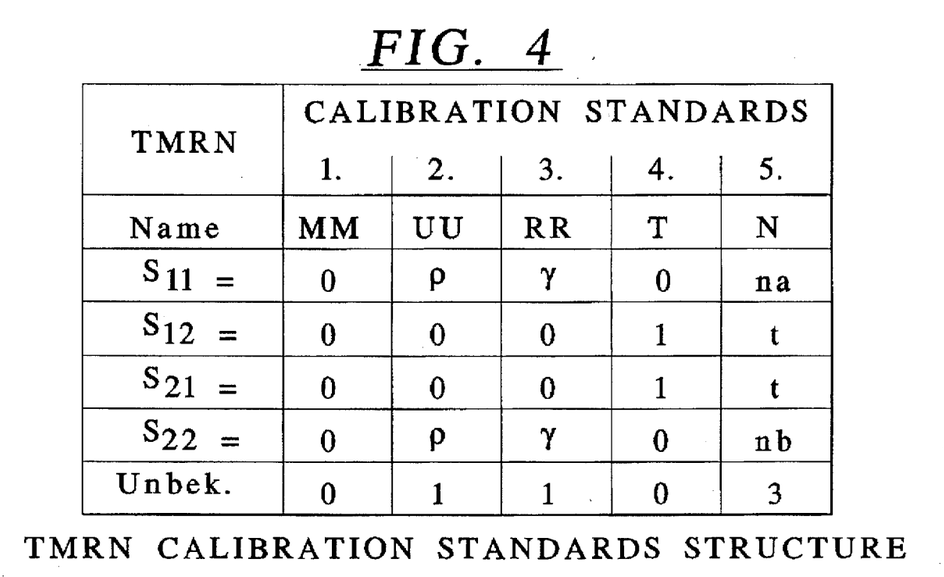
FIG. 4 depicts properties of the TMRN calibration standards.

What capability these new fifteen-term self-calibration methods offer shall be demonstrated by the TMRN method that is especially suitable for coaxial employment (Table 3). Other than the two calibration measurements at, however, unknown standards, this method assumes no more information from the calibration standards than the known seven-term method for a non-coupled double reflectometer.

This TMRN method is especially suitable when it is necessary to identify crosstalk within the NWA.

Figure 5:
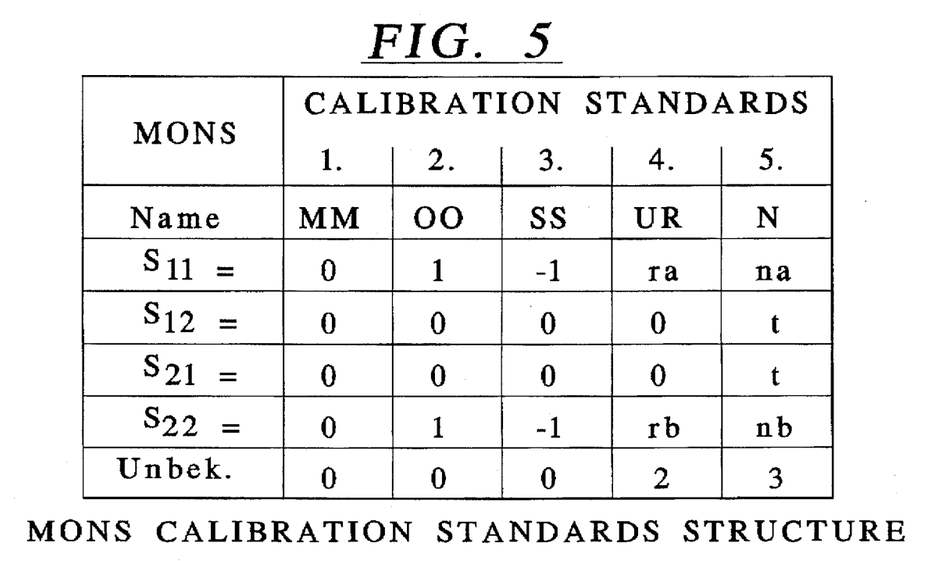
FIG. 5 depicts properties of the MONS calibration standards.

Great value was placed on the exact fabrication of the reflection standards open circuit and short-circuit in commercially obtainable calibration substrates. When one has such a calibration substrate is available, then the self-calibration method referred to as MONS and presented in Table 4 can be of great interest.

This MONS method, however, deviates somewhat from the derivation of the general MURN method since this method contains only one two-port network. Since N1 is a double one-port network standard in this method, the matrix thereof can no longer be inverted, as was implemented in equation (27). Since, however, the two quantities $\gamma$ and $\rho$ of the MURN method are completely known, an inversion of the other side of this matrix equation can be implemented.

The ZORN Methods

The ZORN methods offers interesting advantages compared to the MURN method. The following is a general derivation of ZORN methods for the fifteen-term model that replace the M with a ZY or, respectively, Z standard. The standards are recited in scatter parameters in Table 5 even though Y parameters are employed for the calculation. The measured quantities need not be a matter of signal quantities. Instead, these can be generally treated or can be interpreted as currents and voltages.

Consequently, the transformation matrix of the full model can be presented in the form of equation (58), $$\begin{pmatrix} i_3 \\ i_4 \\ u_3 \\ u_4 \end{pmatrix} = [C] \begin{pmatrix} u_1 \\ u_2 \\ i_1 \\ i_2 \end{pmatrix}, \quad (58)$$

and the unit under test can be presented in Y parameters.

$$\begin{pmatrix} i_3 \\ i_4 \end{pmatrix} = [Yx] \begin{pmatrix} u_3 \\ u_4 \end{pmatrix} \quad (59)$$

Analogous to the derivation of equation (7), an imaging equation having the same structure but now not in scatter parameters but in Y parameters is obtained with equations (58) and (59).

When the values recited in Table 5 are entered for the calibration standards, then the following, five matrix equations derive for identifying the self-calibration quantities.

$$OO: [A]+[E][M1]=0 \quad (60)$$

$$UU: [A]+[E][M2]=ya([B][M2]+[F]) \quad (61)$$

$$RR: [A]+[E][M3]=yb([B][M3]+[F]) \quad (62)$$

$$N: [A]+[E][M4]=[N]([B][M4]+[F]) \quad (63)$$

$$Z: [A]+[E][M5]=[Z]([B][M5]+[F]) \quad (64)$$

The similarity between these five equations and the initial equations (9)–(13) of the MURN method is unmistakable. Consequently, the self-calibration equations of the ZORN methods can be derived in the same way and with the same abbreviations for the measured value matrices.

$$ya(Mu_{11}+Mu_{22})-yb(Mv_{11}+Mv_{22})=\text{trace }([Z]^{-1}) \quad (65)$$

$$ya^2ua+yb^2va-yaybub=det\ ([Z]^{-1}) \quad (66)$$

$$ya(Mw_{11}+Mw_{22})-yb(Mx_{11}+Mx_{22})=spur\ ([N]^{-1}) \quad (67)$$

$$ya^2wa+yb^2xa-yaybwb=det\ ([N]^{-1}) \quad (68)$$

$$ya^2xb+yb^2xc-yaybxd=spur\ ([Z]^{-1}[N]^{-1}) \quad (69)$$

At least three of the eight unknown scatter parameter quantities must be known in this non-linear equation system. A practical, extremely interesting modification for realizing the Z and the N calibration standard is the real parts of two impedances are known that are connected in series. However, the equation system can only be numerically solved in this case. This generally does not represent a great limitation since good starting values with respect to the impedances are available given high-quality calibration substrates.

When, by contrast, two impedances are completely known, then a closed solution may also be found. Since these conditional equations also become extremely long for four unknown impedance values, an example shall not be recited here.

It is self-evident that individual impedances need not be contained at all in the calibration standards. Thus, the ZY standards could be replaced by Z or Y standards. Ultimately, it is only important that the rank of the matrix for calculating the error quantities is always fifteen. Employing a reflection-asymmetrical calibration standard is indispensable for this purpose.

In a comparison of the MURN and ZORN methods, one might think that the ZORN methods are less attractive since they require a completely known O standard. As already discussed, however, this O standard is postulated. This, of course, is only true of the full model since all non-idealities of the open circuit only enter into the error coefficients in this.

When this aspect is recognized, then it is seen that the ZORN method, with all its degrees of freedom insofar as the suitable calibration substrates are available, represents the better alternative.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for calibrating a network analyzer having two test ports and at least four measuring locations, in which measurements of the transmission and reflection parameters at five calibration standards are performed successively, the five calibration standards being successively connected in arbitrary sequence between the two test ports according to a fifteen-term principle, comprising the steps of:

providing one of a one-port network, having known impedance, and an open circuit as a first calibration standard for the first calibration measurement;

successively connecting said one of a one-port network having known impedance and an open circuit to the two test ports to provide first measured values;

using second, third, fourth and fifth calibration standards for second, third, fourth and fifth calibration measurements, respectively, only eleven of a total of sixteen scatter parameters thereof being known, to provide second, third, fourth and fifth measured values; and calculating the remaining five unknown scatter parameters of the sixteen scatter parameters from the first, second, third, fourth and fifth measured values;

wherein correction values that are taken into consideration in following subject measurements are calculated from the first, second, third, fourth and fifth measured values.

2. The method according to claim 1, wherein the first calibrating standard is a double one-port network having known impedance; wherein the second calibration standard is a reflection-symmetrical double one-port network having unknown reflection; wherein the third calibration standard is a further, reflection-symmetrical double one-port network having an unknown reflection factor that differs from a reflection factor of the second calibration measurement; wherein the fourth calibration standard is a reciprocal two-port network having unknown reflection; and wherein the fifth calibration measurement a further reciprocal two-port network having known transmission and unknown reflection factor that differs from a reflection factor of the fourth calibration measurement.

3. The method, according to claim 2, wherein the second calibration standard is a double one-port open circuit, and wherein the fourth calibration standard is an electrical line having a known characteristic impedance whose electrical propagation constant is unknown.

4. The method according to claim 3, wherein the electrical line is a planar stripline.

5. The method according to claim 2, wherein the fourth calibration standard is a direct connection of the two test ports.

6. The method according to claim 2 wherein the second calibration standard is a double one-port open circuit, and wherein the third calibration standard is a double one-port short-circuit.

7. The method according to claim 1, wherein the first calibration standard is a double one-port open circuit; wherein the second calibration standard is a reflection-symmetrical double one-port network that has a common but unknown impedance at each port thereof; wherein the third calibration standard is a further reflection-symmetrical double one-port network that has a common unknown impedance value at each port thereof that differs from the impedance value of the second calibration standard; wherein the fourth calibration standard is a two-port network that is composed of a concentrated, complex but unknown series and/or parallel impedance; and wherein the fifth calibration standard is a further two-port network that is composed of a concentrated parallel impedance and a concentrated, unknown series impedance.

8. The method according to claim 7, wherein one of the two-port networks of the fourth and fifth calibration standards are each formed by a respective known series impedance.

9. The method according to claim 7, wherein one of the two-port networks of the fourth and fifth calibration standards is an electrical line having known characteristic impedance whose electrical propagation constant is unknown.

10. The method according to claim 7, wherein the electrical line is a planar stripline.

11. A method for calibrating a network analyzer having two test ports and at least four measuring locations, in which measurements of the transmission and reflection parameters at five calibration standards are performed successively, the five calibration standards being successively connected in arbitrary sequence between the two test ports according to a fifteen-term principle, comprising the steps of:

providing a double one-port network having known impedance as a first calibration standard for the first calibration measurement;

successively connecting said one-port network to the two test ports to provide first measured values;

providing, as a second calibration standard, a reflection-symmetrical double one-port network having unknown reflection;

providing, as a third calibration standard, a further reflection-symmetrical double one-port network having an unknown reflection factor that differs from a reflection factor of the second calibration measurement;

providing, as a fourth calibration standard, a reciprocal two-port network having unknown reflection;

providing, as a fifth calibration measurement, a further reciprocal two-port network having known transmission and unknown reflection factor that differs from a reflection factor of the fourth calibration measurement;

using the second, third, fourth and fifth calibration standards for second, third, fourth and fifth calibration measurements, respectively, only eleven of a total of sixteen scatter parameters thereof being known, to provide second, third, fourth and fifth measured values; and calculating the remaining five unknown scatter parameters from the first, second, third, fourth and fifth measured values;

wherein correction values that are taken into consideration in the following subject measurements are calculated from the first, second, third, fourth and fifth measured values.

12. The method according to claim 11, wherein the second calibration standard is a double one-port open circuit, and wherein the fourth calibration standard is an electrical line having a known characteristic impedance whose electrical propagation constant is unknown.

13. The method according to claim 11, wherein the fourth calibration standard is a direct connection of the two test ports.

14. The method according to claim 11, wherein the second calibration standard is a double one-port open circuit, and wherein the third calibration standard is a double one-port short-circuit.

15. The method according to claim 11, wherein the electrical line is a planar stripline.

16. A method for calibrating a network analyzer having two test ports and at least four measuring locations, in which measurements of the transmission and reflection parameters at five calibration standards are performed successively, the five calibration standards being successively connected in arbitrary sequence between the two test ports according to a fifteen-term principle, comprising the steps of:

providing a double one-port open circuit as a first calibration standard for the first calibration measurement;

successively connecting said one of a one-port network having known impedance and an open circuit to the two test ports to provide first measured values;

using as a second calibration standard, a reflection-symmetrical double one-port network that has a common but unknown impedance at each port thereof;

using, as a third calibration standard a further reflection-symmetrical double one-port network that has a common known impedance value at each port thereof that differs from the impedance value of the second calibration standard;

using as a fourth calibration standard, a two-port network that is composed of a concentrated, complex but unknown series and/or parallel impedance;

using as a fifth calibration standard a further two-port network that is composed of a concentrated parallel impedance and a concentrated, unknown series impedance;

using the second, third, fourth and fifth calibration standards for second, third, fourth and fifth calibration measurements, respectively, only eleven of a total of sixteen scatter parameters thereof being known, to provide second, third, fourth and fifth measured values; and calculating the remaining five unknown scatter parameters from the first, second, third, fourth and fifth measured values;

wherein correction values that are taken into consideration in the following subject measurements are calculated from the first, second, third, fourth and fifth measured values.

17. The method according to claim 16, wherein one of the two-port networks of the fourth and fifth calibration standard is formed by a known series impedance.

18. The method according to claim 16, wherein one of the two-port networks of the fourth and fifth calibration standards is an electrical line having known characteristic impedance whose electrical propagation constant is unknown.

19. The method according to claim 16, wherein the electrical line is a planar stripline.

\* \* \* \* \*